United States Patent [19]
Anderson et al.

[11] Patent Number: 5,313,091
[45] Date of Patent: May 17, 1994

[54] PACKAGE FOR A HIGH POWER ELECTRICAL COMPONENT

[75] Inventors: W. Kyle Anderson; Arthur Pershall; Lee Thomas; Stephen E. Jackson, all of Rockford; Robert J. Sterling, Rockton, all of Ill.

[73] Assignee: Sundstrand Corporation, Rockford, Ill.

[21] Appl. No.: 952,553

[22] Filed: Sep. 28, 1992

[51] Int. Cl.⁵ .............................................. H01L 23/02
[52] U.S. Cl. .................................... 257/584; 257/587; 257/693; 257/698; 257/704
[58] Field of Search ............... 257/693, 698, 704, 584, 257/587, 709, 708, 710, 678; 174/52.4

[56] References Cited
U.S. PATENT DOCUMENTS

| | | | |
|---|---|---|---|
| 3,312,771 | 4/1967 | Hessinger et al. | 174/52 |
| 3,848,077 | 11/1974 | Whitman | 174/52 S |
| 4,297,722 | 10/1981 | Nagahama et al. | 357/74 |
| 4,651,192 | 3/1987 | Matsushita et al. | 357/74 |
| 4,677,741 | 7/1987 | Takahama | 29/588 |
| 4,710,795 | 12/1987 | Nippert et al. | 357/65 |
| 4,731,644 | 3/1988 | Neidig | 357/72 |
| 4,761,518 | 8/1988 | Butt et al. | 174/52 FP |
| 4,839,717 | 6/1989 | Phy et al. | 357/74 |
| 5,115,300 | 5/1992 | Yanagida et al. | 257/698 |
| 5,166,773 | 11/1992 | Temple et al. | 257/698 |

Primary Examiner—Rolf Hille
Assistant Examiner—Roy Potter
Attorney, Agent, or Firm—Marshall, O'Toole, Gerstein, Murray & Borun

[57] ABSTRACT

A package for a high power electrical component includes a base and a plate disposed on a support surface of the base and having an electrically insulative layer and an outer layer having a conductive portion thereon. An electrically conductive pad is disposed on the electrically conductive portion of the plate and the electrical component is disposed on the pad. A cover is disposed atop the base and encloses the plate, the pad and the electrical component. First and second electrically conductive terminals extend through apertures in the cover and are electrically coupled to the electrodes of the electrical component. The cover is hermetically sealed to the base and to the first and second terminals. The coefficient of thermal expansion of the base and cover are substantially equal to minimize stresses developed therein.

8 Claims, 5 Drawing Sheets

PACKAGE FOR A HIGH POWER ELECTRICAL COMPONENT

BACKGROUND ART

The present invention relates generally to electrical component packages, and more particularly to a package for a high power electrical component that develops substantial heat.

TECHNICAL FIELD

Electrical components that are subjected to high voltages and that conduct high levels of current often develop substantial amounts of heat that must be conducted away from the electrical component as well as other components in the vicinity thereof so as to avoid significant operational difficulties. Typically, high power components are mounted on heat sinks which provide low thermal resistance paths leading away from the electrical component. However, the electrical component is often disposed in a hermetically sealed package which can impede the flow of heat from the component to the heat sink. In addition, heat build-up within the package can cause the package to be subjected to mechanical stresses that in turn adversely affect the integrity thereof. Such a consequence is obviously undesirable and can lead to failure of the component and/or the system in which the component is used.

Matsushita, et al., U.S. Pat. No. 4,651,192 discloses a semiconductor device encased in a hollow ceramic package. Disclosed in FIG. 1 is a device wherein a semiconductor is disposed on an insulating substrate of molybdenum that is in turn mounted on a copper stud. Bonding wires interconnect the semiconductor to lead conductors extending outwardly of the enclosure. A molybdenum substrate having a low coefficient of thermal expansion is bonded between the semiconductor and the copper stud.

High power electrical components disposed within fabricated packages are disclosed in Nagahama, et al., U.S. Pat. No. 4,297,722, Takahama, U.S. Pat. No. 4,677,741 and Neidig, U.S. Pat. No. 4,731,644.

Nippert, et al., U.S. Pat. No. 4,710,795 discloses a semiconductor power module wherein a semiconductor is disposed within two parallel ceramic substrates each having metallizations disposed on at least one side thereof.

Other types of packages for semiconductor devices are disclosed in Hessinger, et al., U.S. Pat. No. 3,312,771, Whitman, U.S. Pat. No. 3,848,077, U.S. Pat. No. 3,848,077, Butt, et al., U.S. Pat. No. 7,761,518 and Phy, et al., U.S. Pat. No. 4,839,717.

SUMMARY OF THE INVENTION

In accordance with the present invention, a package for a high power electrical component is simple in design and is mechanically stable.

More particularly, and in accordance with one aspect of the present invention, a package for a high power electrical component includes a base having a support surface and formed of a material having a coefficient of thermal expansion (CTE) of a first magnitude and a plate including an electrically insulative layer and first and second outer layers disposed on opposite faces of the electrically insulative layer wherein the first outer layer is disposed on the support surface and the second outer layer includes an electrically conductive portion wherein the plate has a CTE greater than the first magnitude. An electrically conductive pad is disposed in contact with the electrically conductive portion of the second outer layer so that electrical contact is established therebetween wherein the pad has a CTE less than the CTE of the plate. The electrical component is disposed on the pad and includes a first electrode in electrical contact with the pad and a second electrode. A cover is disposed on the base and encloses the plate, the pad and the electrical component wherein the cover is formed of a material having a CTE substantially equal to the first magnitude. First and second electrically conductive terminals extend through first and second apertures in the cover wherein the first terminal is electrically coupled to the first electrode of the electrical component through the conductive pad and the electrically conductive portion of the second outer layer of the plate and wherein the second terminal is electrically coupled to the second electrode. Means are provided for hermetically sealing the cover to the base and for hermetically sealing the first and second terminals to the first and second walls, respectively.

Preferably, the electrical component comprises a power transistor whereby the first and second electrodes comprise collector and emitter electrodes thereof, respectively. The power transistor further includes a third electrically conductive terminal extending through a third aperture in the cover wherein the third terminal is electrically connected to a gate electrode of the power transistor.

Also in accordance with the preferred embodiment, the cover is made of alumina formed into a unitary part. The cover may include first through third metallized portions on a top surface thereof in electrical contact with the first through third terminals respectively.

Further, the sealing means preferably comprises solder disposed between the base and the cover and disposed between the terminals and the metallized portions.

In accordance with an alternative embodiment, an optional U-shaped electrically conductive emitter bus at least partially surrounds the power transistor and is enclosed by the cover. The emitter bus is coupled to the second terminal and is further coupled to the second electrode by a plurality of wire bonds.

In a more specific sense, the electrical component comprises an insulated gate bipolar transistor (IGBT) having collector, emitter, gate and kelvin electrodes that are coupled to first through fourth electrically conductive terminals. The electrically conductive terminals extend through first through fourth apertures in the cover, respectively, The cover is made of alumina formed into a unitary part and includes first through fourth metallized portions on a top surface thereof in electrical contact with the first through fourth terminals, respectively. Package is sealed by solder disposed between the base and the cover and between the terminals and the metallized portions.

The package of the present invention is simple in design, is capable of enclosing a high power semiconductor device without suffering adverse mechanical effects arising from thermal stresses and is inexpensive to fabricate. The package also allows high frequency power transmission through the package without the eddy current losses associated with traditional wire feed-through housing construction.

DESCRIPTION OF THE PREFERRED EMBODIMENT

Figure 1:
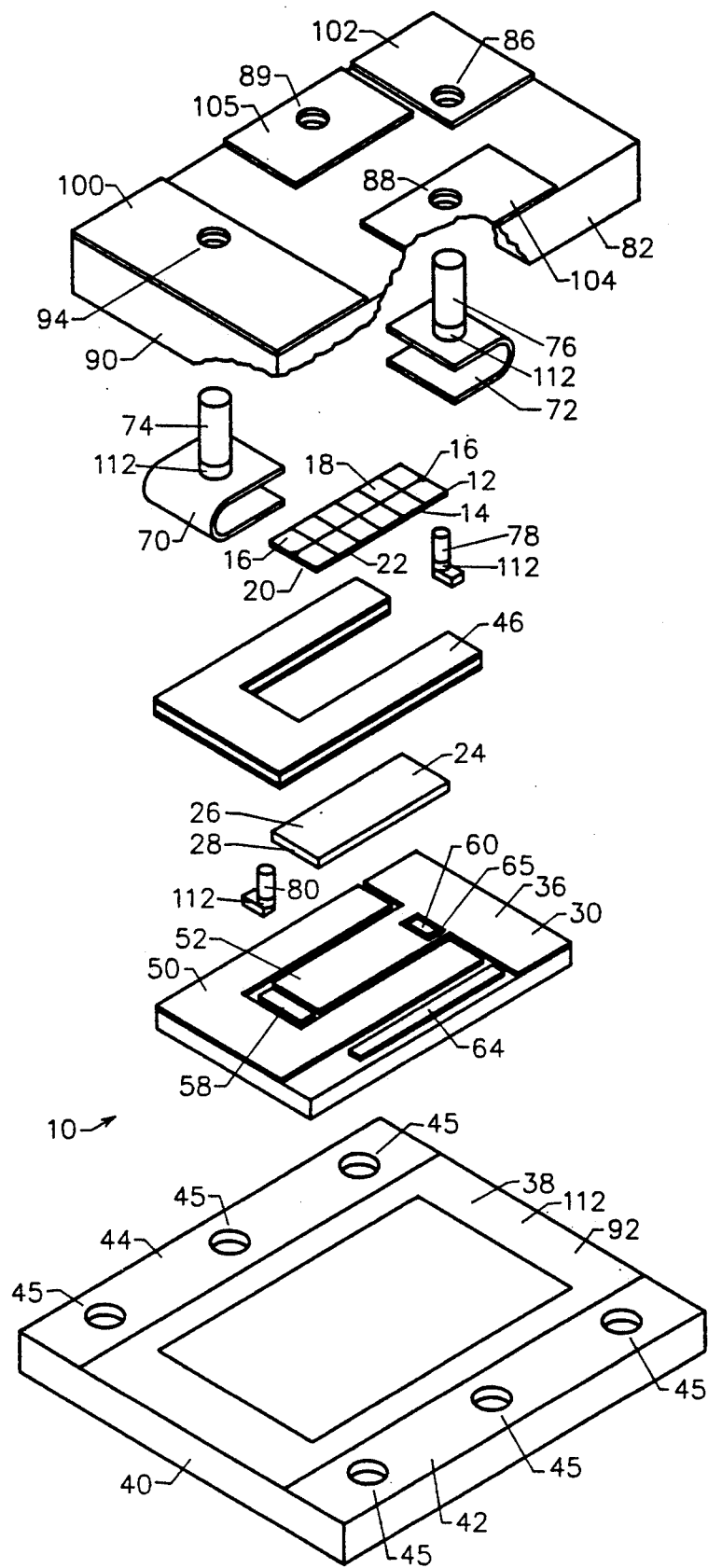
FIG. 1 comprises an exploded isometric view of the package of the present invention.

Referring now to FIG. 1, a package 10 according to the present invention provides an enclosure for a high power electrical component, such as an insulated gate bipolar transistor (IGBT) 12. The IGBT 12 includes a plurality of emitter electrode bonding sites 14, a pair of gate electrode bonding sites 16, both of which are disposed on a first face 18 of the IGBT 12 and a collector electrode 20 disposed on a second face 22 of the IGBT 12.

Figure 2:
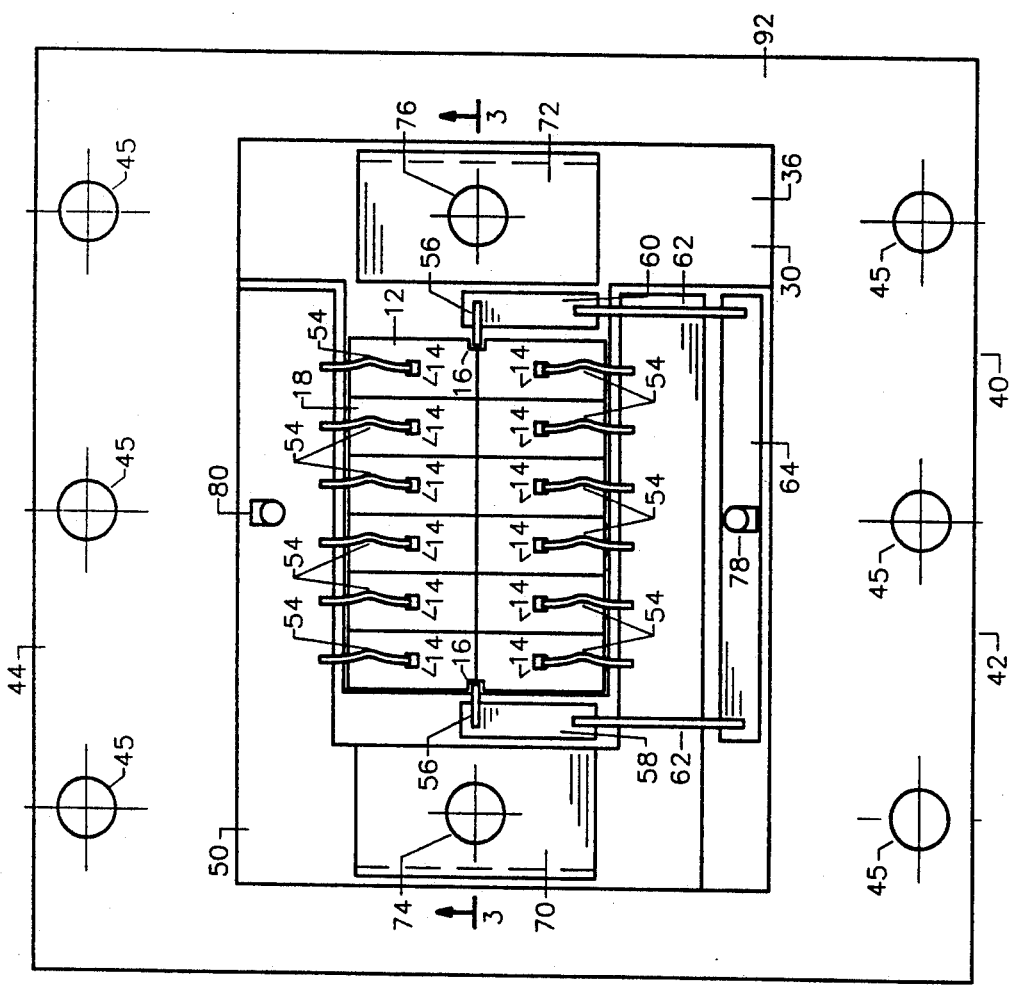
FIG. 2 comprises a plan view of the package of FIG. 1 with the cover removed.
Figure 3:
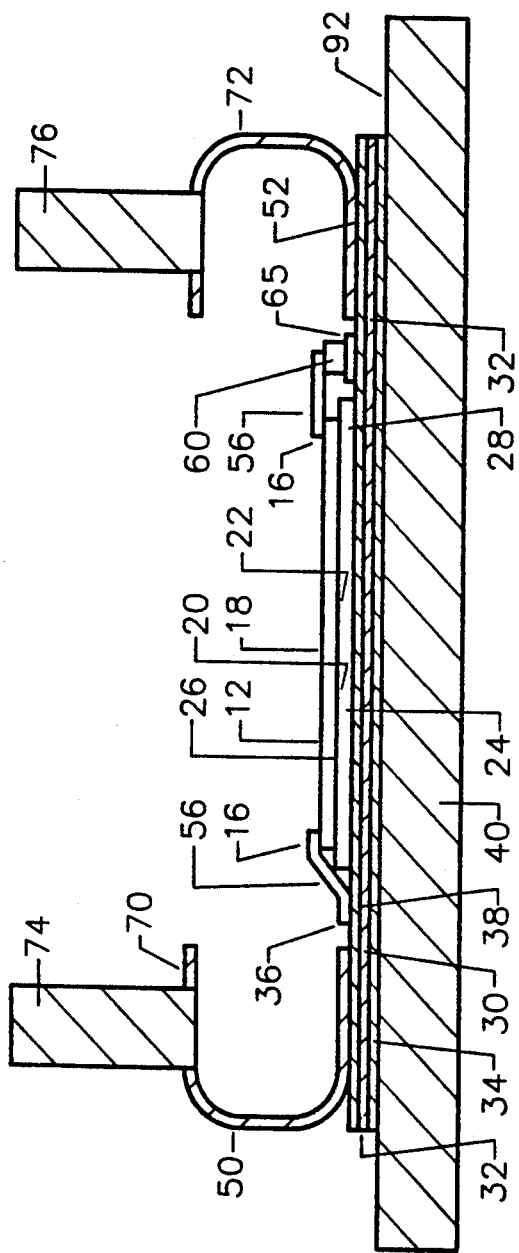
FIG. 3 comprises a sectional view taken generally along the lines 3—3 of FIG. 2.
Figure 4:
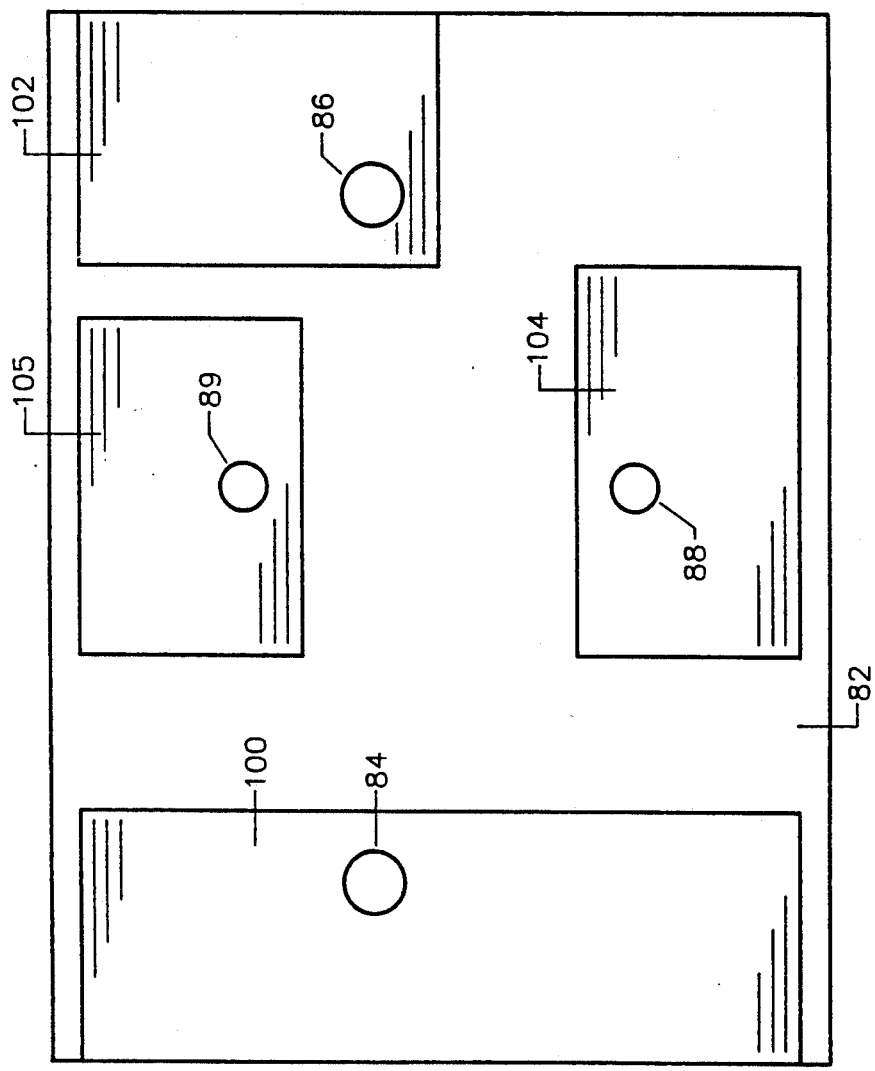
FIG. 4 comprises a plan view of the cover of FIG. 1.

Referring also to FIGS. 2 and 3, the IGBT 12 is brazed atop an optional electrically conductive pad 24 having a low coeffecient of thermal expansion (CTE). In the preferred embodiment, the pad 24 is fabricated of molybdenum having thin layers of nickel or copper formed on opposite faces 26, 28 thereof. The assembled IGBT 12 and pad 24 are then soldered to the top of a plate 30. The plate 30 is of sandwich construction and includes an electrically insulative core or layer 32 and first and second outer layers 34, 36. In the preferred embodiment, the core 32 comprises a beryllia wafer whereas the first and second outer layers comprise copper coatings. The first outer layer 34 comprises a copper coating which may be soldered or brazed to a support surface 38 of a base 40. Further, and as noted in greater detail hereinafter, the second outer layer 36 includes at least one, and preferably multiple conductive portions in the form of copper coatings which provide mechanical and/or electrical connections.

Preferably, the base 40 has a low CTE, like the CTE of the pad 24. As should be evident, the pad 24 acts to compensate for CTE mismatch between the IGBT 12 and the plate 30 in the sense that it permits these elements to expand at different rates in response to heat developed by the IGBT 12. The base 40, which may be fabricated of nickel clad molybdenum or an aluminum matrix composite material, has a low CTE so that mechanical stresses due to thermal expansion are reduced.

The base 40 includes a pair of side portions 42, 44 having holes or apertures 45 therein that permit mounting of the package 10 to a heat sink or other mounting surface.

If desired, an optional U-shaped electrically conductive emitter bus 46 (shown only in FIG. 1) fabricated of nickel clad or copper clad molybdenum may be soldered to the plate 30 such that it at least partially surrounds the IGBT 12 and the pad 24. More particularly, if used, the emitter bus 46 is soldered atop a U-shaped portion 50 of the second outer layer 36, while the pad 24 is soldered atop a conductive portion 52 of the second outer layer 36. Wire bonds 54 are then connected between the emitter electrode bonding sites 14 and the emitter bus 46 the U-shaped portion so that an electrical connection is established therebetween. In addition, further wire bonds 56 are connected between the gate electrode bonding sites 16 and further electrically conductive portions 58, 60 of the second outer layer 36. Still further wire bonds 62 are connected between the portions 58, 60 and an electrically conductive portion 64 of the second outer layer 36. The optional emitter bus 46 may be used to solve problems due to differing CTE's of components. If the emitter bus 46 is not used, the wire bonds 54 are soldered directly to the U-shaped portion 50 of the second outer layer 36.

As seen in FIG. 1, the portion 60 is electrically isolated from the portion 52 by an alumina pad 65 while the portions 50, 52, 58 and 64 are electrically isolated from each other by gaps in the copper coating therebetween. Alternatively, the portion 60 may be a part of a pad of sandwich construction comprising an alumina substrate coated on upper and lower faces thereof by a conductor, such as copper.

A first flexible strip of copper 70 is brazed to the emitter bus 46 (if used) or to the U-shaped portion 50 (if the bus 46 is not used) while a second flexible copper strip 72 is brazed to the portion 52 of the second outer layer 36. Terminals 74, 76 are electrically and mechanically connected to the copper strips 70, 72, respectively, and extend away from the IGBT 12. In addition, a flattened end of a third terminal 78 comprising a wire is soldered to the portion 64 while a flattened end of a fourth terminal 80 comprising a wire is soldered to the portion 50. The wires 78, 80 extend upwardly away from the IGBT 12. The terminals 78, 80 comprise gate and kelvin connections for the IGBT 12.

A cover 82 fabricated of alumina formed by molding into a unitary part is then placed over the components described above such that the terminals 74, 76, 78, 80 extend through walls defining apertures 84, 86, 88, 89, respectively, and so that a peripheral lip 90 is placed in contact with a portion 92 (shown in dotted lines in FIG. 1) of the support surface 38. The peripheral lip 90 includes a metallized coating bonded thereto. In addition, metallized areas 100, 102, 104, 105 are bonded to portions of the upper surface of the cover 82 surrounding the apertures 84, 86, 88 and 89, respectively. The terminals 74, 76, 78, 80 extend through apertures in the terminal blocks 106, 108, 110 and 111, respectively. The package is hermetically sealed by solder 112 (FIG. 1) disposed between the metallized coating on the peripheral lip 90 and the portion 92 of the base 40 and between the terminals 74, 76, 78 and 80 and the walls defining the apertures in the blocks 106, 108, 110 and 111. Preferably, although not necessarily, this step is carried out in a reducing atmosphere or in an inert atmosphere using fluxless solder.

Figure 5:
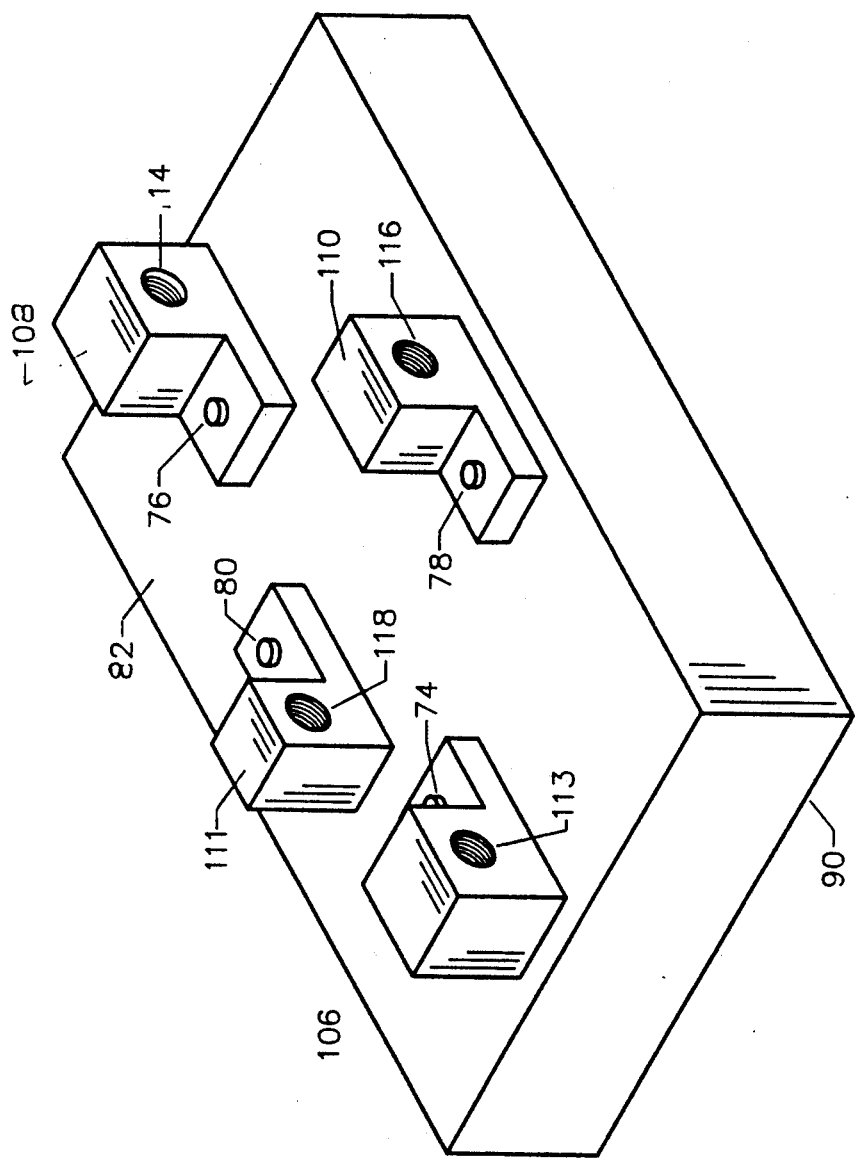
FIG. 5 comprises an isometric view of the cover of FIG. 1 with terminals attached thereto.

Referring also to FIG. 5, electrically conductive terminal blocks 06, 108, 110, 111 are soldered or brazed to the metallized areas 100, 102, 104, 105. The terminal blocks 106, 108, 110, 111 include threaded bores 113, 114, 116 and 118, respectively, Which permit connection of external conductors thereto.

The provision of a low CTE base 40 together with a cover 82 having a CTE substantially equal to the CTE of the base 40 results in a package that does not exert significant mechanical stresses between the cover and base. Further, the use of the low CTE pad 24 between the IGBT 12 and the plate 30 prevents degradation of the electrical and thermal contact between the IGBT 12 and the plate 30 due to mechanical stresses caused by temperature cycling. Further, the copper strips 70 and 72 and the terminals 78, 80 are flexible so that any mechanical stress induced by unequal CTE and so that between the cover 82 and the terminals 74, 76, 78 and 80 is minimal. Electrical contact is maintained with the terminal blocks 106, 108, 110 and 111 during operation of the IGBT 12.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

We claim:

1. A package for a high power electrical component, comprising:
    a base formed of a material having a coefficient of thermal expansion of a first magnitude and including a support surface;
    a plate including an electrically insulative layer and first and second outer layers disposed on opposite faces of the electrically insulative layer wherein the first outer layer is disposed on the support surface and the second outer layer includes an electrically conductive portion and wherein the plate has a coefficient of thermal expansion greater than the first magnitude;
    an electrically conductive pad disposed on the electrically conductive portion of the second outer layer so that electrical contact is established therebetween wherein the pad has a coefficient of thermal expansion less than the coefficient of thermal expansion of the plate;
    wherein the electrical component is disposed on the pad and includes a first electrode in electrical contact with the pad and a second electrode;
    a cover disposed on the base and enclosing the plate, the pad and the electrical component, the cover being formed of a material having a coefficient of thermal expansion substantially equal to the first magnitude;
    first and second electrically conductive terminals extending through first and second apertures in the cover, the first terminal being electrically coupled to the first electrode of the electrical component through the conductive pad and the electrically conductive portion of the second layer of the plate and the second terminal being electrically coupled to the second electrode; and
    means for hermetically sealing the cover to the base and for hermetically sealing the first and second terminals to the first and second apertures, respectively.

2. The package of claim 1, wherein the electrical component comprises a power transistor whereby the first and second electrodes comprise collector and emitter electrodes of the power transistor, respectively, and further including a third electrically conductive terminal extending through a third aperture in the cover and electrically connected to a gate electrode of the power transistor.

3. The package of claim 2, wherein the cover is made of alumina formed into a unitary part.

4. The package of claim 3, wherein the cover includes first through third metallized portions on a top surface thereof in electrical contact with the first through third terminals, respectively.

5. The package of claim 4, wherein the sealing means comprises solder disposed between the base and the cover and disposed between the terminals and the metallized portions.

6. The package of claim 1, wherein the electrical component comprises an insulated gate bipolar transistor (IGBT) whereby the first and second electrodes comprise collector and emitter electrodes of the IGBT, respectively, and further including third and fourth electrically conductive terminals extending through third and fourth apertures in the cover and electrically connected to gate and kelvin electrodes of the IGBT, respectively.

7. The package of claim 6, wherein the cover is made of alumina formed into a unitary part and includes first through fourth metallized portions on a top surface thereof in electrical contact with the first through fourth terminals, respectively, and wherein the sealing means comprises solder disposed between the base and the cover and disposed between the terminals and the metallized portions.

8. The package of claim 1, further including a U-shaped, electrically conductive bus at least partially surrounding the electrical component and enclosed by the cover, wherein the U-shaped bus is coupled to the second terminal and is further coupled to the second electrode by a plurality of wire bonds.

* * * * *